(12) United States Patent
Kalita et al.

(10) Patent No.: US 11,557,464 B2
(45) Date of Patent: Jan. 17, 2023

(54) SEMICONDUCTOR CHAMBER COATINGS AND PROCESSES

(71) Applicant: Applied Materials, Inc., Santa Clara, CA (US)

(72) Inventors: Laksheswar Kalita, San Jose, CA (US); Son Nguyen, San Jose, CA (US); Dmitry Lubomirsky, Cupertino, CA (US); Kenneth D. Schatz, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 157 days.

(21) Appl. No.: 16/891,803

(22) Filed: Jun. 3, 2020

(65) Prior Publication Data

US 2020/0402772 A1 Dec. 24, 2020

Related U.S. Application Data

(60) Provisional application No. 62/864,199, filed on Jun. 20, 2019.

(51) Int. Cl.
*H01L 21/67* (2006.01)
*H01L 21/3065* (2006.01)
*H01J 37/32* (2006.01)
*C23C 16/40* (2006.01)

(52) U.S. Cl.
CPC .... *H01J 37/32495* (2013.01); *H01J 37/3244* (2013.01); *H01J 37/32715* (2013.01); *H01L 21/3065* (2013.01); *H01L 21/67069* (2013.01); *H01L 21/67167* (2013.01); *C23C 16/40* (2013.01); *H01J 37/32091* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 2003/0198749 A1* | 10/2003 | Kumar | ............. | H01J 37/32642 118/723 R |
| 2003/0215963 A1* | 11/2003 | AmRhein | ......... | H01L 21/67069 438/9 |
| 2005/0064247 A1* | 3/2005 | Sane | ...................... | C23C 16/36 428/209 |

(Continued)

*Primary Examiner* — Shamim Ahmed
(74) *Attorney, Agent, or Firm* — Kilpatrick Townsend & Stockton LLP

(57) ABSTRACT

Systems and methods may be used to produce coated components. Exemplary semiconductor chamber components may include an aluminum alloy comprising nickel and may be characterized by a surface. The surface may include a corrosion resistant coating. The corrosion resistant coating may include a conformal layer and a non-metal layer. The conformal layer may extend about the semiconductor chamber component. The non-metal oxide layer may extend over a surface of the conformal layer. The non-metal oxide layer may be characterized by an amorphous microstructure having a hardness of from about 300 HV to about 10,000 HV. The non-metal oxide layer may also be characterized by an $sp^2$ to $sp^3$ hybridization ratio of from about 0.01 to about 0.5 and a hydrogen content of from about 1 wt. % to about 35 wt. %.

5 Claims, 6 Drawing Sheets

(56) References Cited

U.S. PATENT DOCUMENTS

| | | | | |
|---|---|---|---|---|
| 2005/0070104 A1* | 3/2005 | O'Meara | ........... | H01L 21/67276 |
| | | | | 438/689 |
| 2012/0264051 A1* | 10/2012 | Angelov | ........... | H01L 21/67161 |
| | | | | 156/345.52 |
| 2015/0307982 A1* | 10/2015 | Firouzdor | ............. | C23C 14/221 |
| | | | | 427/523 |
| 2016/0081216 A1* | 3/2016 | Shirasaki | .............. | H01L 23/057 |
| | | | | 361/752 |
| 2017/0062184 A1* | 3/2017 | Tran | .................. | H01J 37/32532 |

* cited by examiner

SEMICONDUCTOR CHAMBER COATINGS AND PROCESSES

CROSS REFERENCES TO RELATED APPLICATIONS

This application claims the benefit of priority to U.S. Provisional Patent Application No. 62/864,199 filed Jun. 20, 2019, the contents of which are hereby incorporated by reference in their entirety for all purposes.

TECHNICAL FIELD

The present technology relates to semiconductor systems, processes, and equipment. More specifically, the present technology relates to systems including or forming coatings on chamber components.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Wet processes may also damage chamber components. For example, HF etchants may chemically attack chamber components made from metals, such as aluminum alloys. Dry etches produced in local plasmas formed within the substrate processing region can penetrate more constrained trenches and exhibit less deformation of delicate remaining structures. However, local plasmas may damage the substrate through the production of electric arcs as they discharge. Local plasmas, as well as plasma effluents may damage chamber components as well.

Thus, there is a need for improved systems and methods that can be used to produce high quality devices and structures. These and other needs are addressed by the present technology.

SUMMARY

Systems and methods may be used to produce coated components. Exemplary semiconductor chamber components may include an aluminum alloy comprising nickel and may be characterized by a surface. The surface may include a corrosion resistant coating. The corrosion resistant coating may include a conformal layer and a non-metal oxide layer. The conformal layer may extend about the semiconductor chamber component. The non-metal oxide layer may extend over a surface of the conformal layer. The non-metal oxide layer may be characterized by an amorphous microstructure having a hardness of from about 300 HV to about 10,000 HV. The non-metal oxide layer may also be characterized by an $sp^2$ to $sp^3$ hybridization ratio of from about 0.01 to about 0.5 and a hydrogen content of from about 1 wt. % to about 35 wt. %

In some embodiments, the non-metal oxide layer may include diamond-like carbon, silicon carbide, or parylene. The conformal layer may include electroless plated nickel, Newton's metal, or barium titanate. The surface of the conformal layer may be characterized by a surface roughness of from about 29 Sa to about 30 Sa, of from about 1 Sv to about 1000 Sv, and of from about 0.001 Sdr to about 10 Sdr. The conformal layer may include a phosphorus content of from about 5 wt. % to about 20 wt. %. The surface of the semiconductor chamber component may define one or more apertures. The conformal layer may extend conformally through each of the one or more apertures. The surface of the semiconductor chamber component may be textured to a depth of at least about 1 µm. The corrosion resistant coating may be characterized by a thickness of from about 100 nm to about 200 µm.

The present technology may also encompass methods of coating a component of a semiconductor processing chamber. The methods may include positioning a component having an exposed surface within a chamber. The methods may also include depositing a conformal layer about the exposed surface of the component. The conformal layer may be characterized by an exposed surface opposite a surface in contact with the component. The methods may include preparing the exposed surface of the conformal layer. Preparing the exposed surface of the conformal layer may include flowing an argon-containing precursor into a processing region of the semiconductor processing chamber, forming a plasma from the argon-containing precursor to produce plasma effluents, and contacting the surface of the conformal layer with the plasma effluents. The methods may also include depositing a non-metal oxide layer over the surface of the conformal layer. The non-metal oxide layer may be characterized by an amorphous microstructure.

In some embodiments, the exposed surface of the component includes an aluminum alloy including nickel. The component may include one or more of a liner, a chamber dome, a chamber wall, a cover plate, a showerhead, a puck, a pedestal, or an edge ring. The component may include one or more apertures. The conformal layer may extend conformally through each of the one or more apertures. The conformal layer may include electroless plated nickel, Newton's metal, or barium titanate. The non-metal oxide layer may include diamond-like carbon, silicon carbide, or parylene. The methods may also include preparing the exposed surface of the conformal layer by texturing the surface of the conformal layer. The methods may further include texturing the exposed surface of the component to a depth of at least about 1 µm before depositing the conformal layer.

The present invention may also encompass etching methods. The methods may include flowing a fluorine-containing etchant into a semiconductor processing chamber. The semiconductor process chamber may be maintained at a temperature less than or about 0° C. with a relative humidity of greater than or about 10% to 90%. The methods may also include etching a substrate positioned on a pedestal within the semiconductor processing chamber with the fluorine-containing etchant. The methods may also include contacting the pedestal with the fluorine-containing etchant. The pedestal may include a corrosion resistant coating. The corrosion resistant coating may include a conformal layer and a non-metal oxide layer. The conformal layer may extend about the pedestal and include a surface characterized by a surface roughness of from about 29 Sa to about 30 Sa. The non-metal oxide layer may extend over the surface of the conformal layer. The non-metal oxide layer may be characterized by an amorphous microstructure having a hardness of from about 300 HV to about 10,000 HV. The non-metal oxide layer may be characterized by an $sp^2$ to $sp^3$ hybridization ratio of from about 0.01 to about 0.5 and a hydrogen content of from about 1 wt. % to about 35 wt. %. The wafer-level particle contribution from the pedestal may be maintained at less than or about 0.01 ppm for nickel and less than or about 0.01 ppm for aluminum during the etching.

In some embodiments, the non-metal oxide layer may include diamond-like carbon, silicon carbide, or parylene. The pedestal may define one or more apertures. The conformal layer may extend conformally through each of the one or more apertures. The conformal layer may include electroless plated nickel, Newton's metal, or barium titanate. The conformal layer may include a phosphorus content from about 5 wt. % to about 20 wt. %.

Such technology may provide numerous benefits over conventional systems and techniques. For example, coatings according to the present technology may provide both corrosion and erosion protection to chamber components that may limit component degradation. Additionally, the coatings may also protect substrates being processed from contamination due to degrading components. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
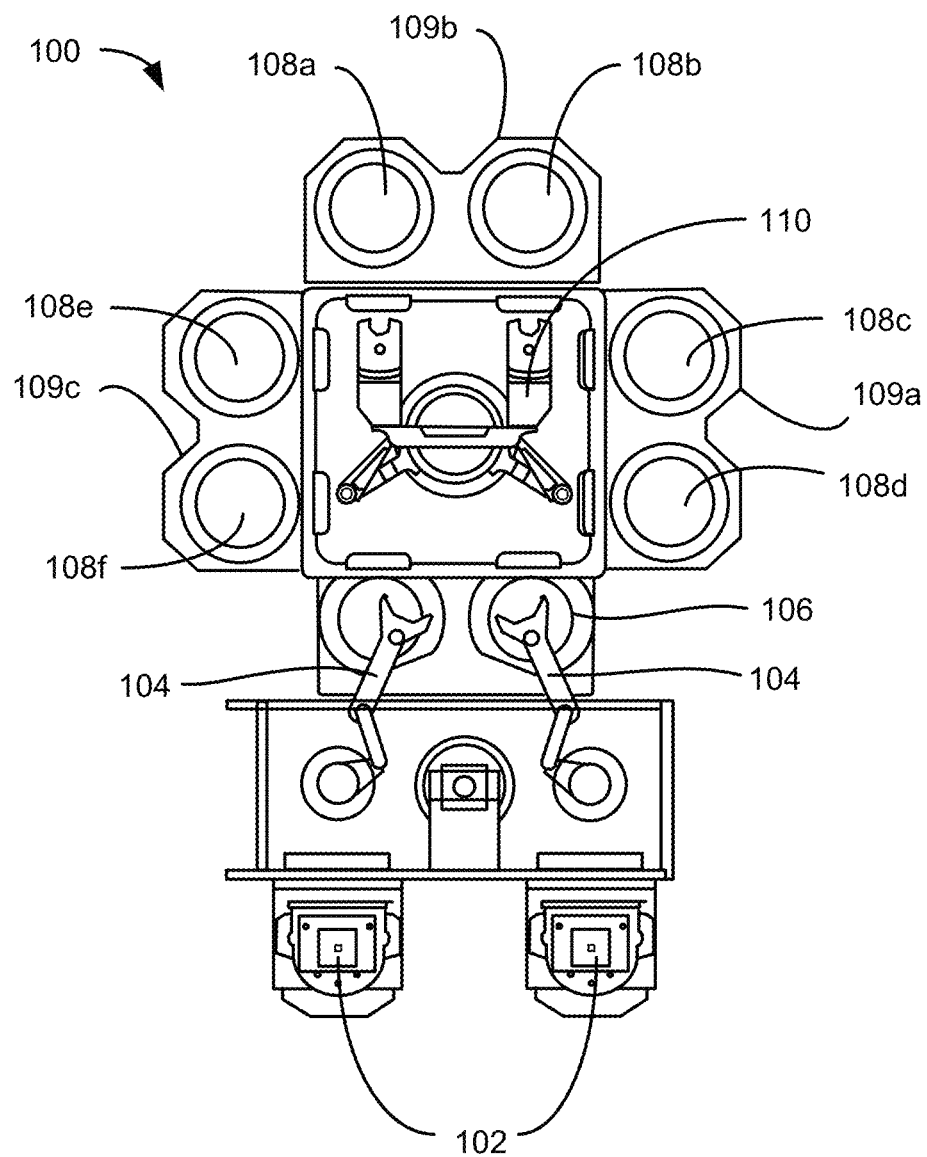
FIG. 1 shows a top plan view of one embodiment of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include partial or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing. Specifically, the present disclosure relates to a corrosion resistant coating for semiconductor components that prevents corrosive attack of the components during etching and cleaning processes. Conventional technologies have struggled with minimizing wafer-level particle contribution from components, especially for fluorine-containing processes in high humidity conditions. Additionally, conventional technologies have struggled with adhesion of corrosion resistant coatings during subzero application.

Atomic layer etching is a process that utilizes a multiple-operation process of damaging or modifying a material surface followed by an etching or removal operation. The etching operation may be performed at chamber conditions allowing the modified material to be removed, but limiting interaction with unmodified materials. This process may then be cycled any number of times to etch additional materials. Some chambers available can perform both operations within a single chamber. The modification may be performed with a bombardment operation at the substrate level, followed by a remote plasma operation to enhance etchant precursors capable of removing only the modified materials. In other cases, the modification may be performed through contacting the substrate with a chemical etchant to remove only the modified materials.

During the modification operation, a chemical etchant may be introduced into the processing region. For example, a fluorine-containing gas may be flowed into the processing region where the gas contacts a substrate positioned within the region. While the etchant may preferentially etch the substrate material, the chemical etchant may also contact other components within the chamber. The etchant may chemically attack the components, especially in high humidity conditions. The chemical damage to the chamber components caused by the etchant may be termed corrosion.

Damage to the chamber components may also occur during plasma modification operations. During a plasma modification operation, a wafer-level plasma may be formed within the processing region. For example, a bias plasma may be formed from the substrate support, which may form a plasma of a precursor within a processing region. The plasma may direct ions to the surface of the substrate to leverage higher ion density. The bias plasma may be a capacitively-coupled plasma, which may produce plasma effluents throughout the processing region with a high plasma potential. An inductively-coupled plasma formed above the substrate may provide a more controlled delivery of plasma effluents, while the capacitively-coupled plasma may develop plasma species that may cause bombardment of chamber components that may lead to sputtering, which may cause damage to chamber components as well as deposition of particulate matter on the substrate being processed.

During the removal or etching operation, an additional plasma process may be performed in which plasma effluents are produced in a remote portion of the chamber, or in a fluidly coupled external unit. These effluents may be delivered through the chamber to interact with the substrate to be processed. During these processes, chamber components may be contacted by one or both of the modifying plasma effluents or the removal plasma effluents. The modifying plasma effluents may cause physical damage to chamber components, which may be termed erosion. The etching plasma effluents may cause a chemical damage to chamber components, which may be termed corrosion.

Conventional technologies have struggled to limit both corrosion and erosion to chamber components, and tend to replace components regularly due to the damage caused by one or both of these mechanisms. However, additional issues include unwanted deposition of metal or other particulate matter from the chamber components or formed materials, which may impact device quality when these materials deposit on the substrate. The present technology overcomes these issues by utilizing one or more coatings to protect chamber components from corrosion. Additionally, the present technology provides improved protective coatings which allow for a larger range of operating conditions, such as subzero temperatures and high humidity conditions, without impacting the lifetime and stability of the coatings.

Although the remaining disclosure will routinely identify specific etching processes utilizing the disclosed technology, it will be readily understood that the systems and methods are equally applicable to deposition and cleaning processes as may occur in the described chambers and also include plasma or other reactive materials. Accordingly, the technology should not be considered to be so limited as for use with etching processes alone.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric or metallic film on the substrate wafer. In one configuration, two pairs of the processing chambers, e.g., 108c-d and 108e-f, may be used to deposit material on the substrate, and the third pair of processing chambers, e.g., 108a-b, may be used to etch the deposited material. In another configuration, all three pairs of chambers, e.g., 108a-f, may be configured to etch a dielectric or metallic film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
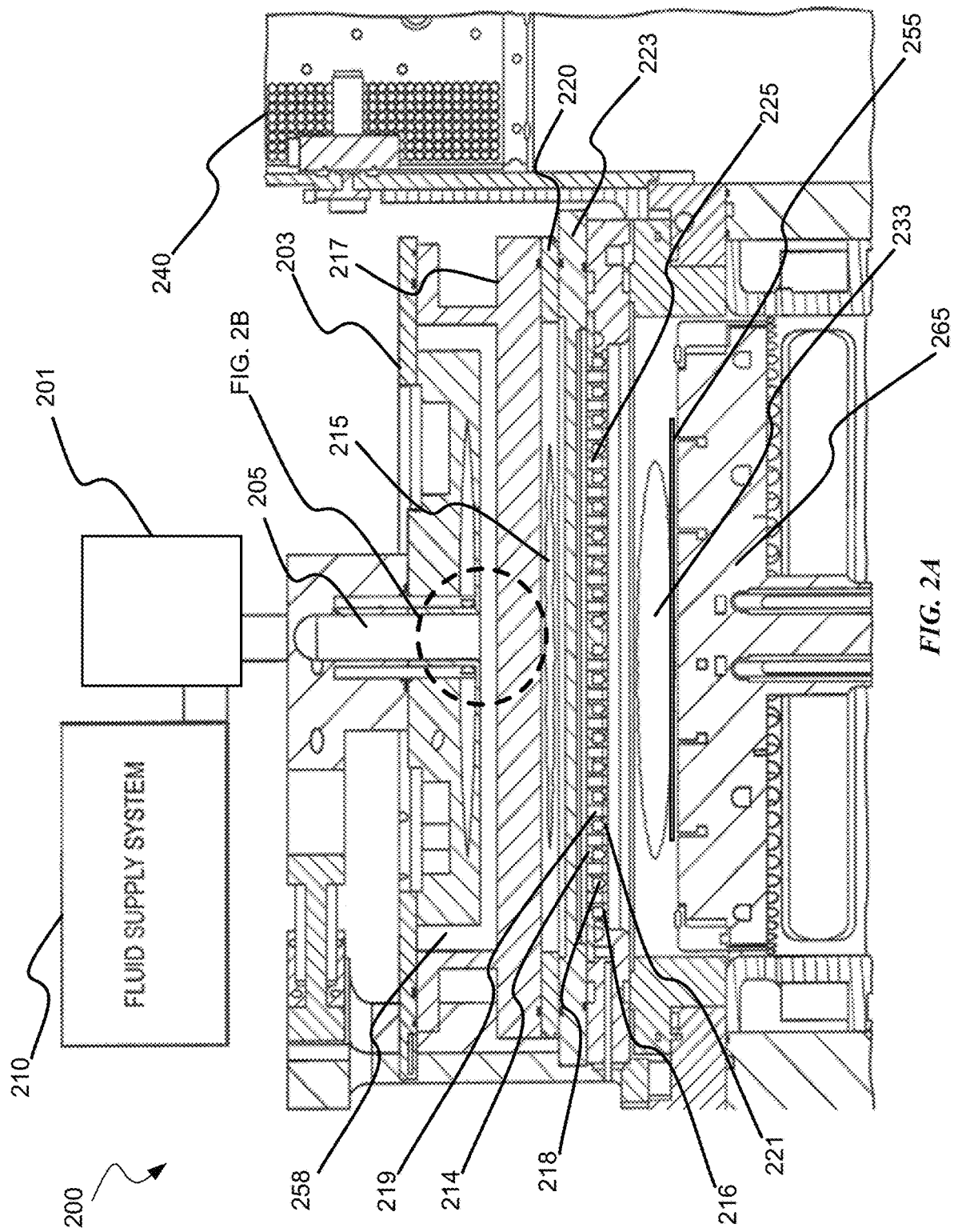
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, copper, cobalt, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from about 100° C. to about 600° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
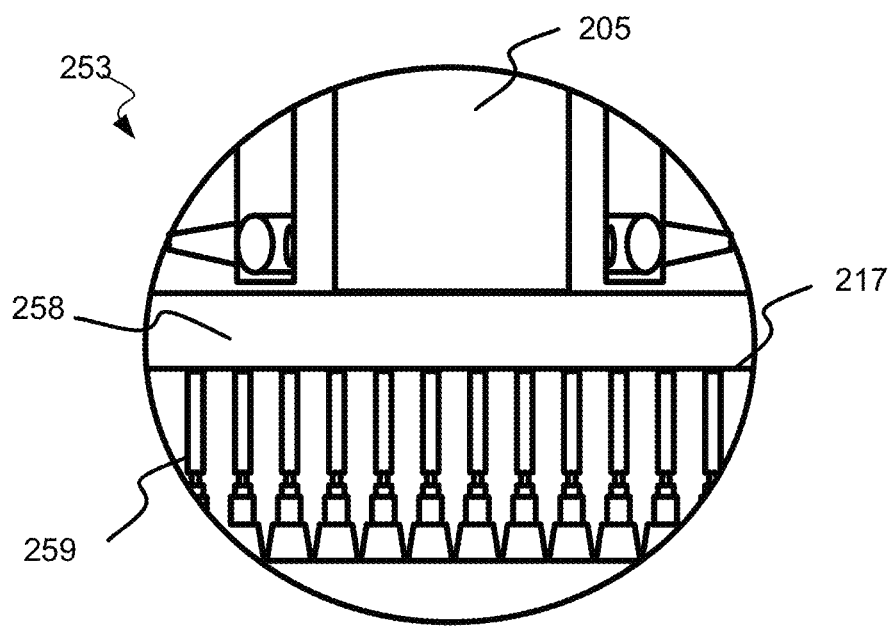
FIG. 2B shows a detailed view of a portion of the processing chamber illustrated in FIG. 2A according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
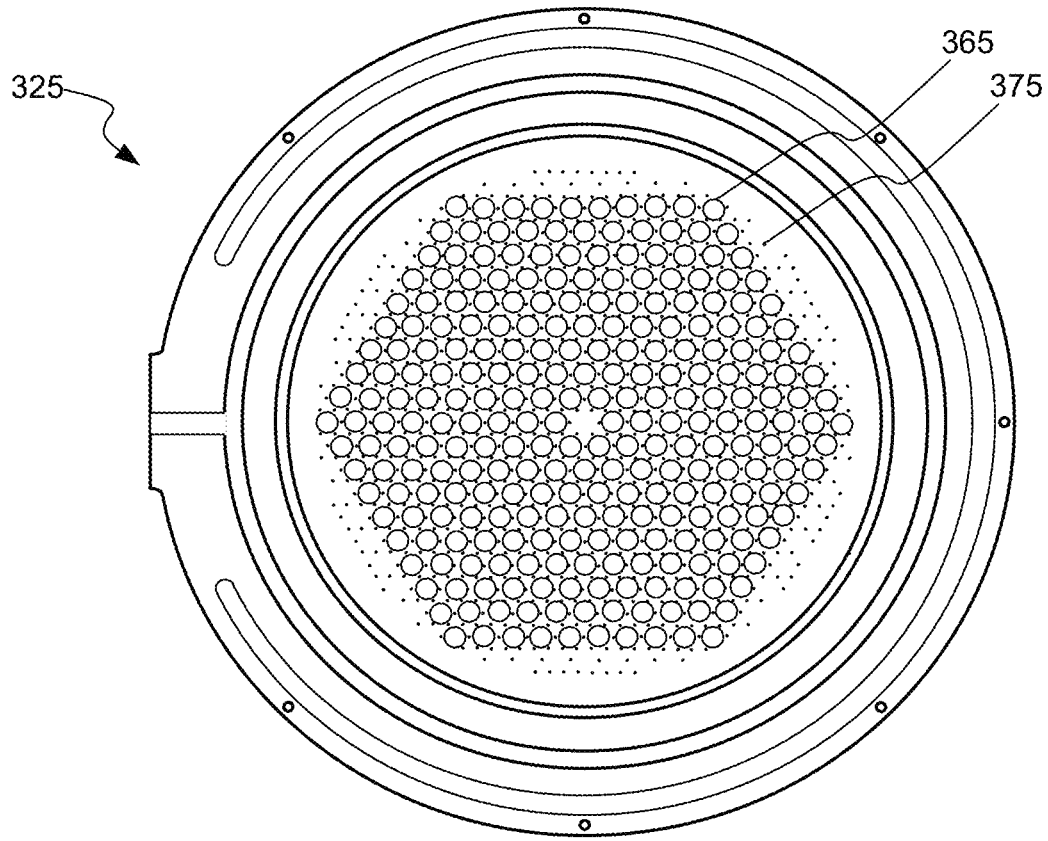
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4A:
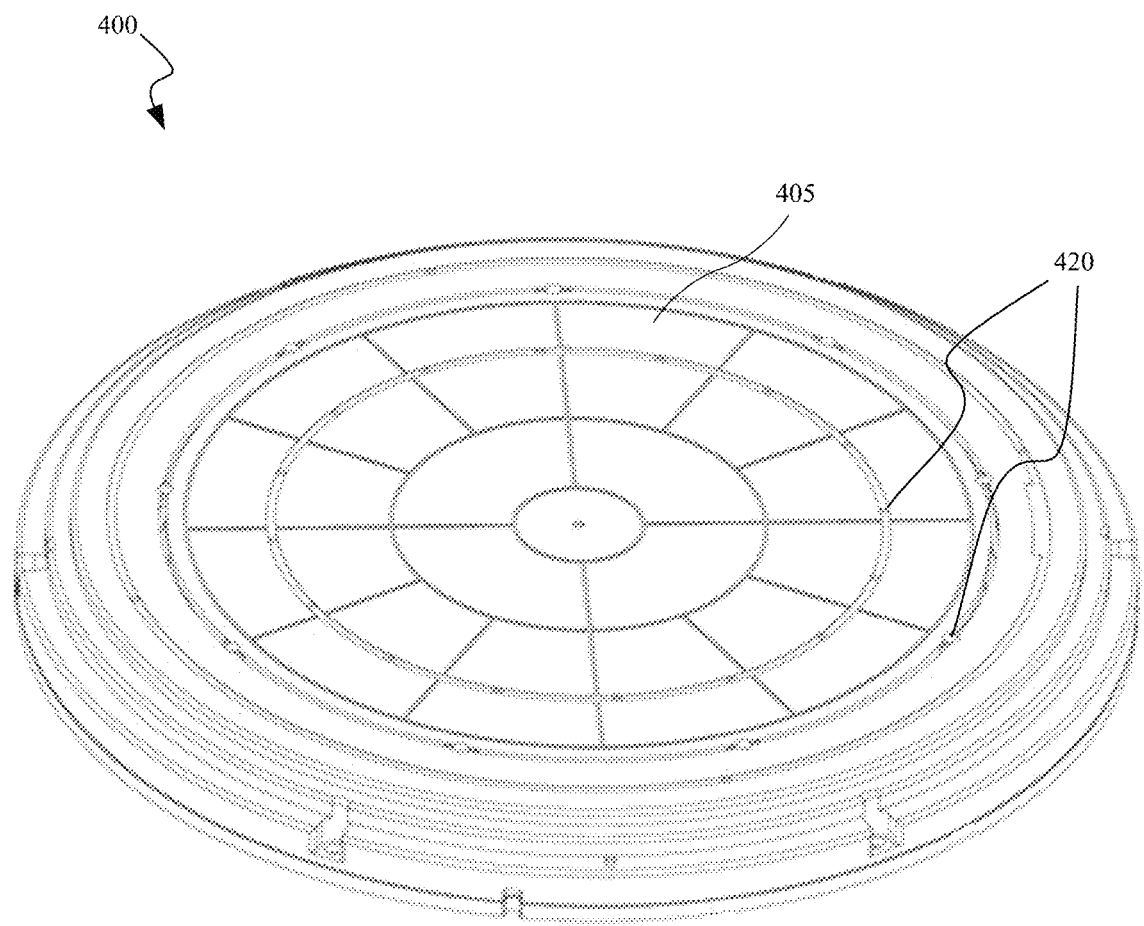
FIG. 4A shows a top view of a component that may be coated with the corrosion resistant coatings according to embodiments of the present technology.

FIG. 4A shows a top isometric view of a component 400 that may be coated with the corrosion resistant coatings according to some embodiments of the present technology. As shown in FIG. 4A, the component 400 may be a top plate or puck of a pedestal onto which a substrate is positioned during processing. For example, in some embodiments the component 400 may be part of pedestal 265 as previously described. The component 400 may be positioned within a semiconductor processing chamber, such as, for example, substrate processing chamber 108a-f, process chamber system 200, or any of the processing chambers described herein.

As illustrated in FIG. 4A, the component 400 may include a surface 405. The surface 405 may include a plurality of features, such as groves, that allow for improved substrate processing or chucking. In some embodiments, the component 400 may include a plurality of apertures 420. The apertures 420 may be present for chucking and/or purging in some embodiments. For example, vacuum may be applied to a substrate positioned on component 400 using apertures 420. In some embodiments, the apertures 420 may be used to purge processing gas or residual particles or materials from the processing chamber. One or more apertures 420 may be present on component 400 in some embodiments, as described in further detail below with reference to FIGS. 4C and 4D.

The component 400 may be configured for low temperature applications. In embodiments where the component 400 is a pedestal located within the semiconductor processing region, during low temperature applications the component 400 may be exposed to low temperatures, or may receive a temperature controlled fluid for providing temperatures for semiconductor processing. For example, a temperature-controlled fluid may be delivered through channels formed in component 400, which may produce a low-temperature or higher-temperature surface, and which may be used to control a temperature of a substrate seated on the component. Processing temperatures at which the component 400 may be maintained may include temperatures of less than or about 10° C., less than or about 0° C., less than or about –10° C., less than or about –20° C., or less than or about –30° C. To withstand low temperatures and the associated temperature swings between the low temperatures and ambient and/or high temperatures, the component 400 may include materials having physical or material properties that prevent degradation of the component 400 under these conditions. In some embodiments, the component 400 may also be configured for high temperature applications. For example, the component 400 may be configured for applications in which the temperature may be greater than or about 25° C., greater than or about 35° C., greater than or about 50° C., greater than or about 75° C., greater than or about 100° C., greater than or about 150° C., or greater than or about 200° C.

Figure 4B:
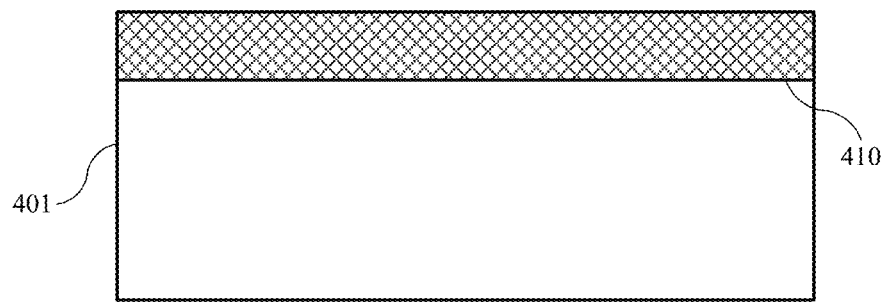
FIG. 4B-4D show cross-sectional views of exemplary corrosion resistant coatings deposited on a component according to some embodiments of the present technology.
Figure 4C:
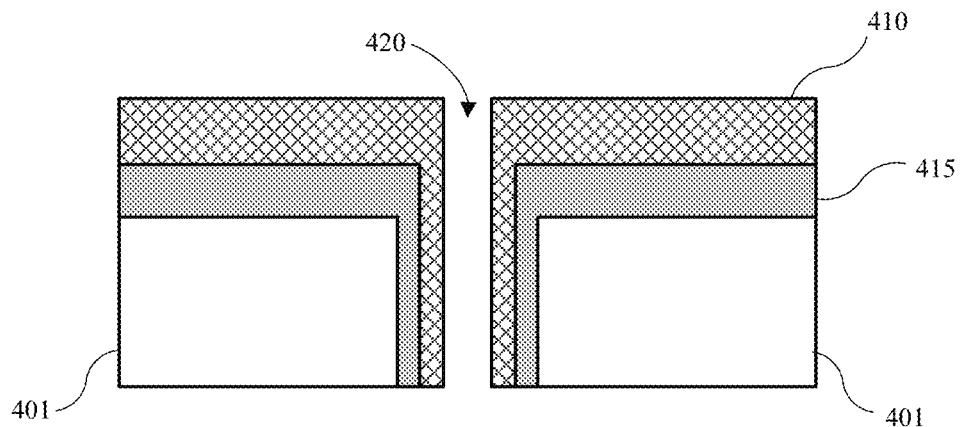
Figure 4D:
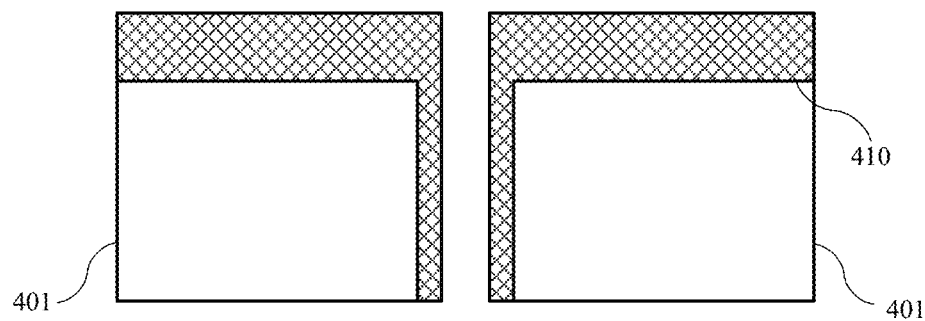

FIGS. 4B-4D show schematic cross-sectional views of exemplary corrosion resistant coatings deposited on a component 401 according to some embodiments of the present technology. The figures provide exemplary views of various coating configurations intended to illustrate possible coating applications encompassed by embodiments of the present technology, and may include coatings on a number of components in chamber system 200, as well as component 400, or other components that may benefit from corrosion resistant coatings. It is to be understood that additional and alternative coating applications may be used. The coating application, such as number of layers and type of layers formed, may depend on the type of component the coating is applied to and the configuration of the component. For example, if the component includes one or more apertures, then two layers may be applied to the component 401 to form the corrosion resistant coating, which may include one layer of a conformally formed material 415 to provide complete coverage of the component through the aperture, and/or a second layer of a non-metal oxide material 410, which may provide protection against corrosive attack. The exemplary chamber component 401 provided in FIGS. 4B-4D may be an illustration of any of the chamber components previously described, including a chamber liner, a chamber dome, a chamber wall, a cover plate, a showerhead, a faceplate, a puck, a pedestal, or an edge ring. In some embodiments, the exemplary chamber component 401 may be the component 400 described with respect to FIG. 4A.

In some embodiments, the chamber component 401 may be made from an aluminum alloy. Aluminum alloys often contain impurities of various alloying metals, even when the chamber component 400 contains high purity aluminum alloy. For example, aluminum alloys generally contain trace amounts of nickel, copper, iron, manganese, and chromium. In some embodiments, impurities may be present in aluminum alloys at the following atomic weight %: nickel ranging from about 0.001% to about 0.5%; iron ranging from about 0.001% to about 0.25 weight %; copper ranging from about 0.15% to about 0.35%; manganese ranging from about 0.001% to about 0.2%; zinc ranging from about 0.001% to about 0.15%; chromium ranging from about 0.04% to about 0.28%; titanium ranging from about 0.001% to about 0.06%, and magnesium ranging from about 0.8% to about 1.2%. Optionally, a total of other impurities present in the aluminum alloy may be about 0.15 weight % or less.

During processes, including etching and cleaning, chemical etchants and gases may chemically attack any exposed metal surfaces, such as the aluminum alloy of component 401. Even when coated using conventional coatings, process gases may permeate the coatings or etch through the coatings to contact the underlying component 401. Aluminum alloys, such as those used to make component 401, may have an increased propensity for corrosive attack by process gases. Aluminum alloys may be prone to corrosive attack because of the alloying elements within their composition. Nickel, copper, manganese, chromium, and aluminum tend to be reactive under aggressive process conditions, such as conditions that the component 401 may be exposed to within the substrate processing region. Corrosive attack of component 401 may increase under high humidity applications. For example, during high humidity applications, fluorine within the fluorine-containing etchants may interact with the water vapor in the air to form hydrofluoric acid. Hydrofluoric acid is highly corrosive and may readily penetrate and corrode the component 401. High humidity applications may include applications in which the relative humidity is greater than or about 10%, greater than or about 20%, greater than or about 30%, greater than or about 40%, greater than or about 50%, greater than or about 60%, greater than or about 70%, greater than or about 80%, greater than or about 90%, or greater than or about 95%. For example, a high humidity application may be an application in which the relative humidity is from 10% to 90%.

When process gases attack component 401, particles from component 401 may be displaced and deposited on the substrate wafer. The corrosion resistant coatings provided herein may reduce wafer-level particle contribution from component 401. Metals such as nickel and aluminum are often found on substrate wafers after processing when conventional coatings are used to protect component 401. Any unwanted particle contribution, such as from alloying metals, may negatively impact the performance of a semiconductor substrate, such as by causing shorting or damage to formed features.

By forming the corrosion resistant coating on chamber component 401, particle contamination onto the substrates being processed may be reduced. In embodiments of the present technology using the corrosion resistant coatings on one or more chamber components, such as component 401, may reduce wafer-level particle contribution to less than or about 0.1 ppm for nickel, less than or about 0.005 ppm for calcium, less than or about 0.0005 ppm for copper, less than or about 0.005 ppm for iron, less than or about 0.0005 ppm for magnesium, less than or about 0.0005 ppm for manganese, less than or about 0.001 ppm for potassium, less than or about 0.005 ppm for sodium, less than or about 0.005 ppm for titanium, less than or about 0.0005 ppm for zinc, and/or less than or about 0.005 ppm for aluminum, and less than or about 0.005 ppm for chromium.

The illustration also includes an exemplary corrosion resistant coating applied to a surface of chamber component 401. It is to be understood that the coating may be included on all surfaces of the component in embodiments, and is shown as covering only the depicted surfaces for illustrative purposes. The corrosion resistant coating may be resistant to corrosion and be configured to protect component 401 from reactive etchants, including halogen-containing effluents, gases, or etchants. For example, the corrosion resistant coating may be configured to protect component 401 from fluorine-containing etchants or gases, even in humid conditions.

In some embodiments, the corrosion resistant coating may be or include a non-metal oxide layer 410 which may extend over an exposed surface of component 401. Due to the formation process of non-metal oxide layer 410, complete coverage of the component 401 may be achieved. In some embodiments, non-metal oxide layer 410 may conformally extend over component 401. The corrosion resistant coating may extend about the chamber component 401 to achieve a thickness of coverage of from 100 nm to 200 μm. For example, the thickness of coverage may be less than or about 250 μm, less than or about 200 μm, less than or about 150 μm, less than or about 100 μm, less than or about 50 μm, less than or about 25 μm, less than or about 20 μm, less than or about 15 μm, less than or about 10 μm, less than or about 5 μm, less than or about 3 μm, less than or about 1 μm, less than or about 750 nm, less than or about 500 nm, less than or about 250 nm, less than or about 100 nm, less than or about 50 nm, or less. Because the time to achieve increased thickness may be relatively long in some embodiments, the thickness of corrosion resistant coating may be between about 100 nm and about 300 nm in some embodiments. In some embodiments, depending on hardness of the coating, the thickness of coverage may be thinner. For example, the greater the hardness of non-metal oxide layer 410 the thinner the thickness of coverage may be.

Non-metal oxide layer 410 may be characterized by an amorphous microstructure, in which an amorphous phase of material at least partially exists in the layer, and in some embodiments the entire layer may be characterized by an amorphous phase of material. For example, non-metal oxide layer 410 may include a hard carbon material, such as diamond-like carbon, silicon carbide, or parylene. An amorphous microstructure may be advantageous for protecting the component 401 from corrosion because when a microstructure is amorphous, the less-defined grain boundaries of the material may be less susceptible to permeation by etchants and chemical attack on the component. Crystalline microstructures tend to have more defined grain boundaries, which can increase permeation and expose the material to chemical attack. Similarly, metal oxide materials may be more susceptible to corrosive attack, due to the increased interaction with halogen-containing etchants or gases. Accordingly, a non-metal oxide may provide improved protection against corrosion.

Exemplary non-metal oxide layers 410 may be characterized by hardness values of from 300 HV to 10,000 HV. Hardness may impact the resistivity of non-metal oxide layer 410 to chemical attack. The harder the material (e.g., the greater the hardness value) the less susceptible the material may be to corrosive attack. Materials having higher hardness values may include those having higher amounts of $sp^3$ hybridized carbon. Carbon naturally exists in various forms or allotropes. Different allotropes provide various physical and mechanical properties, one of which being hardness, depending on the hybridization of the carbon. For example, non-metal oxide layer 410 may have an $sp^2$ to $sp^3$ hybridization ratio of from about 0.01 to about 0.5, which may provide for a hardness of from about 300 HV to about 10,000 HV. In some embodiments, the $sp^2$ to $sp^3$ hybridization ratio may be from about 0.025 to about 0.5, from about 0.05 to about 0.5, from about 0.075 to about 0.5, from about 0.1 to about 0.5, or from about 0.25 to about 0.5. When the $sp^2$ to $sp^3$ hybridization ratio is low, higher amounts of $sp^3$ hybridized carbon may be present. Hard-carbon material with higher amounts of $sp^3$ hybridization may be characterized as being diamond-like carbon. Diamond-like carbon may be characterized by greater hardness relative to other allotropes. For example, diamond-like carbon may have a hardness value of from about 4,000 HV to about 8,000 HV, from about 5,000 HV, to about 7,000 HV, or about 6,000 HV in some embodiments, depending on the bonding structure. Silicon carbide is another carbon-containing material that may have a higher hardness value depending on the ratio of $sp^2$ to $sp^3$ hybridized carbon. For example, silicon carbide may have a hardness value of from about 1,000 HV to about 3,000 HV.

Non-metal oxide layer 410 may also be characterized by a reduced hydrogen content. For example, non-metal oxide layer 410 may have a hydrogen content of from about 1 wt. % to about 35 wt. %, from about 2 wt. % to about 35 wt. %, from about 5 wt. % to about 35 wt. %, from about 10 wt. % to about 35 wt. %, from about 12 wt. % to about 32 wt. %, from about 15 wt. % to about 30 wt. %, from about 18 wt. % to about 28 wt. %, or from about 20 wt. % to about 25 wt. %. Some conventional hard carbon materials may be characterized by high hydrogen content (e.g., greater than 35 wt. % or greater than 40 wt. % of hydrogen). However, according to some embodiments of the present technology, a reduced hydrogen content may provide improved protection against corrosive attack.

In some embodiments, the corrosion resistant coating may be or include parylene. Parylene is a common name for a series of polymers based on paraxylene, specifically poly (p-xylylene). Three common types of parylene include parylene N, parylene C, and parylene D. In exemplary embodiments, non-metal oxide layer 410 may be or include parylene-C, which may be characterized by a higher molecular weight, which may improve deposition and coverage properties.

As illustrated in FIGS. 4C and 4D, component 401 may in some embodiments include one or more apertures 420. When component 401 includes aperture 420, the corrosion resistant coating may extend through aperture 420. As depicted in FIG. 4C, the corrosion resistant coating may include two or more layers in some embodiments, such as non-metal oxide layer 410 and conformal layer 415. Conformal layer 415 may extend conformally about component 401. When component 401 includes one or more apertures 420, conformal layer 415 may extend conformally through each aperture 420. In some embodiments, extending conformally through each aperture 420 may provide complete coverage of (i.e., fully coating) all surfaces of component 401, including surfaces within aperture 420. In other embodiments, extending conformally may provide coverage through each aperture 420 of greater than or about 90% coverage, greater than or about 95% coverage, greater than or about 98% coverage, greater than or about 99%, or more.

Non-metal oxide layer 410 may also extend through aperture 420. In some embodiments, non-metal oxide layer 410 may not achieve as complete of coverage as conformal layer 415. To prevent corrosive attack to component 401 material exposed within aperture 420, conformal layer 415 may first be applied in some embodiments, such as depending on the aperture size and coverage capabilities of the non-metal oxide layer. Non-metal oxide layer 410 may then be deposited to extend over conformal layer 415. However, in some embodiments, non-metal oxide layer 410 may be applied to component 401 and may extend through aperture 420, as illustrated FIG. 4D, without conformal layer 415 deposited between component 401 and non-metal oxide layer 410.

Conformal layer 415 may be or include electroless plated nickel, electroplated nickel, barium titanate, or a Newton's metal coating in embodiments. In embodiments where conformal layer 415 includes electroless plated nickel, the phosphorus content of conformal layer 415 may be greater than or about 2.5% by weight, greater than or about 5% by weight, greater than or about 10% by weight, greater than or about 15% by weight, or greater than or about 20% by weight. An increase in phosphorus content may increase the corrosion resistivity of the corrosion resistant coating.

In some embodiments, conformal layer 415 may extend about the component 401 to a thickness of coverage of less than or about 25 μm, and may extend to a thickness of less than or about 20 μm, less than or about 15 μm, less than or about 10 μm, less than or about 5 μm, less than or about 3 μm, less than or about 1 μm, less than or about 750 nm, less than or about 500 nm, less than or about 250 nm, less than or about 100 nm, less than or about 50 nm, or less. Because the time to achieve increased thickness may be relatively long in some embodiments, the thickness of conformal layer 415 may be between about 100 nm and about 300 nm in some embodiments. In embodiments where the thickness of conformal layer 415 may be greater than or about 3 μm or about 5 μm, non-metal oxide layer 410 may not be included.

Conventional coatings may exhibit poor adhesion to components or other layers. Poor adhesion may be more pronounced in low temperature applications. For example, conventional coatings may peel off of a component or an underlying layer during or after applications where one or more components of the substrate processing chamber are at a temperature of less than or about 10° C., less than or about 0° C., less than or about −10° C., less than or about −20° C., less than or about −30° C., or less than or about −60° C. However, coatings according to some embodiments of the present technology may have improved adhesion because due to materials used, or surface preparation methods and pretreatment methods for conformal layer 415. In some embodiments, the corrosion resistant coating according to the present technology may exhibit improved adhesion at low temperature applications compared to conventional technologies, which typically peel at low temperature.

To improve adhesion, conformal layer 415 may be pretreated in some embodiments prior to deposition of non-metal oxide layer 410 onto the conformal layer 415. For example, in embodiments, conformal layer 415 may be textured or cleaned before deposition of non-metal oxide layer 410. In some embodiments, the texturing may be performed to a depth up to or greater than the layer depth of conformal layer 415. For example, when conformal layer 415 is applied to component 401, conformal layer 415 may be textured via machining, beading or other blasting techniques, or other roughening or texturing operations. In various embodiments, conformal layer 415 may be pretreated via a plasma or other chemical exposure. For example, an argon or oxygen plasma may be generated within the processing region or within a remote plasma unit to form plasma effluents. The exposed surface of conformal layer 415 may be bombarded with plasma effluents. Bombardment of the surface of conformal layer 415 may clean and/or texture the surface of conformal layer 415. The texturing may be performed to a depth of at least about 50 nm, and may be performed to a depth of at least about 100 nm, at least about 250 nm, at least about 500 nm, at least about 750 nm, at least about 1 μm, at least about 3 μm, at least about 5 μm, or more, although the texturing may not extend to a depth greater than the overall thickness of the conformal layer 415 to limit exposure of underlying materials, and ensure coverage.

In embodiments, conformal layer 415 may be characterized by a surface roughness of from about 25 Sa to about 35 Sa. The surface roughness of the conformal layer may correspond to the roughness of the exposed surface of conformal layer 415. Surface roughness may express the difference in height of each surface high point compared to the arithmetical mean of the surface. In other words, the greater the surface roughness, the rougher the surface or greater contrast between the mean of the surface and surface high points. An increase in surface roughness may improve adhesion of non-metal oxide layer 410 to conformal layer 415. In some embodiments, conformal layer 415 may be characterized by a surface roughness of from about 25 Sa to about 35 Sa, and may be characterized by a roughness of from about 26 Sa to about 34 Sa, from about 27 Sa to about 33 Sa, from about 28 Sa to about 32 Sa, from about 29 Sa to about 31 Sa, from about 29.2 Sa to about 30.8 Sa, from about 29.5 Sa to about 30.5 Sa, or from about 29.8 Sa to about 30.2 Sa. In some embodiments, the surface roughness may be characterized by the maximum pit height (Sv) or developed interfacial area ratio (Sdr). In such embodiments, the conformal layer 415 may be characterized by a surface roughness of from about 1 Sv to about 110 Sv, from about 5 Sv to about 100 Sv, from about 10 Sv to about 90 Sv, or from about 20 Sv to about 80 Sv. Similarly, in some embodiments, the conformal layer 415 may be characterized by a surface roughness of from about 0.0001 Sdr to about 10 Sdr, from about 0.001 Sdr to about 10 Sdr, from about 0.01 Sdr to about 8 Sdr, or from about 0.1 Sdr to about 5 Sdr. Sa, Sv, and Sdr values may, in some embodiments, be in units of μ-inches.

In some embodiments, component 401 may be textured before formation of either or both of non-metal oxide layer 410 or conformal layer 415 of the corrosion-resistance coating to improve adhesion. For example, coatings may have improved adhesion to textured surfaces. In some embodiments, the texturing may be performed to a depth up to or greater than either or both layer thickness of the corrosion resistant coating. For example, prior to depositing conformal layer 415, or between deposition of conformal layer 415 and non-metal oxide layer 410, component 401 may be textured via machining, bead or other blasting techniques, or other roughening or texturing operations. The texturing may be performed to a depth of at least about 50 nm, and may be performed to a depth of at least about 100 nm, at least about 250 nm, at least about 500 nm, at least about 750 nm, at least about 1 µm, at least about 3 µm, at least about 5 µm, or more, although the texturing may not extend to a depth greater than the overall thickness of the corrosion resistant coating to limit exposure of underlying materials, and ensure coverage.

Various deposition methods and techniques may be used for applying the corrosion resistant coating. Exemplary techniques include physical vapor deposition (PVD), chemical vapor deposition (CVP), cyclical layer deposition (CLD), atomic layer deposition (ALD), plasma-enhanced chemical vapor deposition (PECVD), vacuum deposition, and other thin film deposition methods. In some embodiments, PVD may be used to apply non-metal oxide layer 410 to component 401. In some embodiments, PECVD may be used to apply non-metal oxide layer 410. In some embodiments, more than one application technique may be used for deposition, such that the non-metal oxide layer 410 may be deposited using one method while the conformal layer 415 may be deposited using a different method. In some embodiments, the non-metal oxide layer 410 may include a PVD diamond-like coating, a PECVD silicon carbide layer, or a vacuum deposited parylene layer, while conformal layer 415 may include an electroless plated nickel layer.

Figure 5:
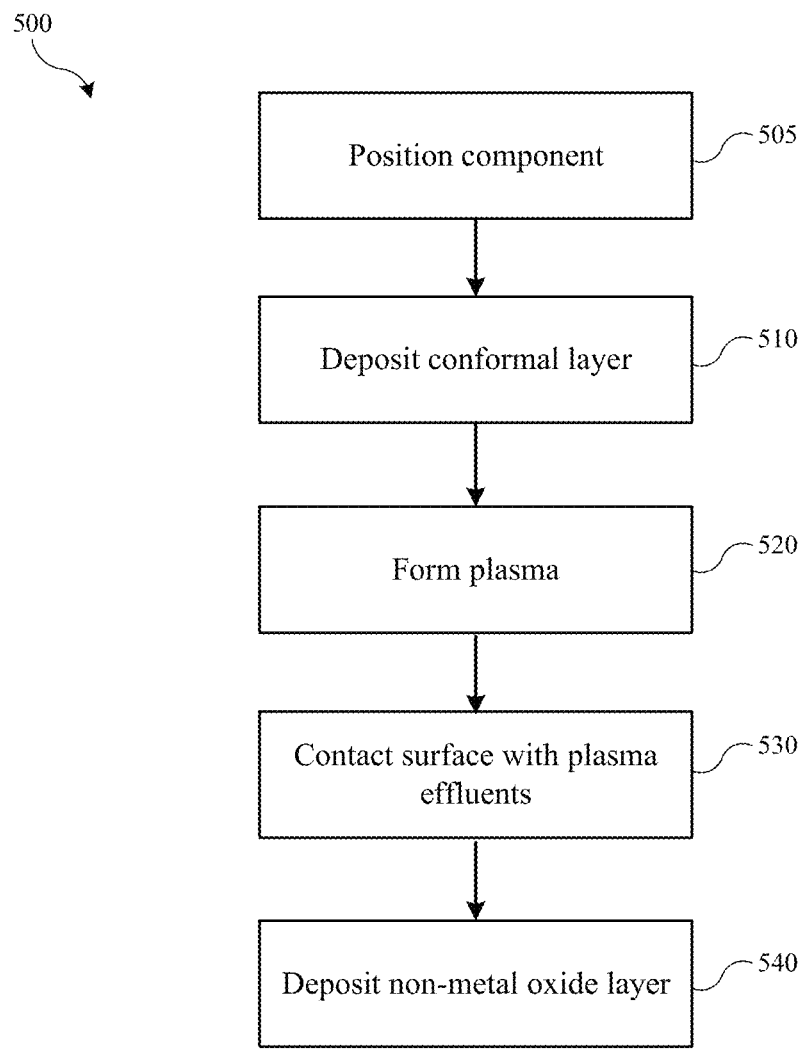
FIG. 5 show exemplary operations in a method according to some embodiments of the present technology.

FIG. 5 illustrates exemplary operations in a method 500 according to some embodiments of the present technology, and will be discussed with reference to the coating system components of FIGS. 4A-D. Method 500 may include operation 505 at which a component may be positioned within a processing region. The component may be any of the components discussed herein, such as component 400 or exemplary chamber component 401. At operation 510, conformal layer 415 may be deposited onto the component. For example, an electroless plated nickel layer may be deposited onto component 401. Conformal layer 415 may conformally extend about the component and through any apertures present as part of the component.

Conformal layer 415 may be prepared before non-metal oxide layer 410 is applied. In some embodiments, the non-metal oxide layer 410 may exhibit reduced adhesion to an exposed surface of conformal layer 415 or the surface of component 401. This adhesion may be due in part to reduced chemical bond formation between the non-metal oxide layer 410 and the surface. To improve adhesion of the non-metal oxide layer 410, in some embodiments the surface of conformal layer 415 may be prepared for or during the deposition. Surface preparation may include cleaning, wet cleaning, or surface texturing of an exposed surface of conformal layer 415. An exposed surface of component 401 may also be prepared prior to deposition of conformal layer 415 in some embodiments.

As provided by method 500, surface preparation of conformal layer 415 may include plasma enhancement. To prepare the surface of conformal layer 415, conformal layer 415 may be exposed to plasma effluents. At operation 520, a plasma may be formed to generate plasma effluents. In some embodiments, a plasma may be formed in a remote plasma region within the chamber or fluidly coupled with the chamber and the plasma effluents generated from the remote plasma may be flowed into the processing region in accordance with the discussion above with reference to FIGS. 1-3. In some embodiments the plasma may be formed locally within the processing region and plasma effluents may be generated from the plasma within the processing region. Once the plasma effluents are generated, at operation 530, the surface of conformal layer 415 may be contacted with the plasma effluents to prepare the surface or deposit the non-metal oxide layer.

The plasma generated at operation 520 may be, in some embodiments, an oxygen-containing plasma or an argon-containing plasma. Other types of plasmas may also be used for method 500. In embodiments where the plasma is an argon-containing plasma, the corrosion resistivity of the coating may be improved over surface preparation using other types of plasmas, such as an oxygen-containing plasma or other mechanisms for producing the coating. For example, in some embodiments, formation of the conformal layer 415 with an argon-containing plasma may reduce wafer-level particle contribution by improving the adhesion and performance of the coating. For example, surface preparation or coating formation with an argon-containing plasma, which may include or consist of a plasma formed from argon gas, may reduce particle contribution by greater than or about 50% for certain particles relative to oxygen-plasmas or other preparation or formation techniques, which may not be included or used with the argon-containing plasma. In some embodiments, for example, aluminum, calcium, chromium, copper, iron, magnesium, manganese, nickel, potassium, sodium, titanium, and/or zinc particle contribution may be reduced by greater than or about 55% of the contribution amounts stated previously when formation or preparation occurs with an argon plasma, and may be reduced by greater than or about 60%, greater than or about 65%, greater than or about 70%, greater than or about 75%, greater than or about 80%, greater than or about 85%, greater than or about 90%, greater than or about 95%, greater than or about 99%, or more.

After the surface of conformal layer 415 is prepared, or during the plasma processing, non-metal oxide layer 410 may be deposited onto the surface of conformal layer 415 at operation 540. The non-metal oxide layer 410 may be deposited using any of the techniques disclosed herein. For example, parylene may be deposited using vacuum deposition techniques after the exposed surface of conformal layer 415 is plasma enhanced.

Corrosion resistant coatings formed via method 500 may protect chamber components from chemical attack during processes, such as etching and cleaning, The corrosion resistant coatings provided herein may reduce wafer-level particle contribution to the wafer. Consequently, the present technology may improve device production, while additionally increasing component life within the processing chamber.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. An etching method, the method comprising:
    flowing a fluorine-containing etchant into a semiconductor processing chamber, wherein the semiconductor process chamber is maintained at a temperature less than or about 0° C. with a relative humidity of greater than or about 10% to 90%;
    etching a substrate positioned on a pedestal within the semiconductor processing chamber with the fluorine-containing etchant;
    contacting the pedestal with the fluorine-containing etchant, wherein the pedestal comprises a corrosion resistant coating, wherein the corrosion resistant coating comprises:
        a conformal layer which extends about the pedestal, wherein the conformal layer comprises a surface characterized by a surface roughness of from about 29 Sa to about 30 Sa, and
        a top layer which extends over the surface of the conformal layer, wherein the top layer is characterized by an amorphous microstructure having a hardness of from about 300 HV to about 10,000 HV, and wherein the top layer is characterized by a $sp^2$ to $sp^3$ hybridization ratio of from about 0.01 to about 0.5 and a hydrogen content of from about 1 wt. % to about 35 wt. %; and wherein wafer-level particle contribution from the pedestal is maintained at less than or about 0.01 ppm for nickel and less than or about 0.01 ppm for aluminum during the etching.

2. The etching method of claim 1, wherein the top layer comprises diamond-like carbon, silicon carbide, or parylene.

3. The etching method of claim 1, wherein the pedestal defines one or more apertures and wherein the conformal layer extends conformally through each of the one or more apertures.

4. The etching method of claim 1, wherein the conformal layer comprises electroless plated nickel, Newton's metal, or barium titanate.

5. The etching method of claim 1, wherein the conformal layer comprises a phosphorus content from about 5 wt. % to about 20 wt. %.

* * * * *